United States Patent
Cohen et al.

(10) Patent No.: US 7,952,165 B2
(45) Date of Patent: May 31, 2011

(54) HETEROJUNCTION BIPOLAR TRANSISTOR (HBT) WITH SELF-ALIGNED SUB-LITHOGRAPHIC METAL-SEMICONDUCTOR ALLOY BASE CONTACTS

(75) Inventors: Guy M. Cohen, Mohegan Lake, NY (US); Francois Pagette, Jefferson Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 910 days.

(21) Appl. No.: 11/621,864

(22) Filed: Jan. 10, 2007

(65) Prior Publication Data

US 2008/0164495 A1 Jul. 10, 2008

(51) Int. Cl.
*H01L 27/082* (2006.01)
(52) U.S. Cl. .......... 257/571; 257/578; 257/584
(58) Field of Classification Search .......... 257/565, 257/566, 567, 568, 569, 570, 571, 572, 573, 257/574, 575, 576, 578, 579, 580, 583, 584, 257/585, 586, 587
See application file for complete search history.

(56) References Cited

U.S. PATENT DOCUMENTS

| | | | |
|---|---|---|---|
| 6,287,930 B1 | 9/2001 | Park | |
| 6,417,058 B1 | 7/2002 | Richardson et al. | |
| 6,489,211 B1 | 12/2002 | Freeman, Jr. et al. | |
| 6,492,238 B1 | 12/2002 | Ahlgren et al. | |
| 6,551,889 B2 | 4/2003 | Kovacic | |
| 6,667,521 B2 | 12/2003 | Ahlgren et al. | |
| 6,767,798 B2 * | 7/2004 | Kalnitsky et al. | 438/341 |
| 6,861,323 B2 | 3/2005 | Shideler | |
| 6,864,560 B2 | 3/2005 | Khater et al. | |
| 7,390,720 B2 * | 6/2008 | Pagette | 438/309 |
| 2009/0203184 A1 * | 8/2009 | Magnee et al. | 438/369 |

FOREIGN PATENT DOCUMENTS

CN 1630937 A 6/2005

* cited by examiner

*Primary Examiner* — Matthew S Smith
*Assistant Examiner* — John M Parker
(74) *Attorney, Agent, or Firm* — Scully, Scott, Murphy & Presser, P.C.; Louis J. Percello, Esq.

(57) ABSTRACT

A heterojunction bipolar transistor structure with self-aligned sub-lithographic extrinsic base region including a self-aligned metal-semiconductor alloy and self-aligned metal contacts made to the base is disclosed. The lateral dimension of the extrinsic base region is defined by the footprint of a sacrificial spacer, and its thickness is controlled by selective epitaxy. A self-aligned semiconductor-metal alloy and self-aligned metal contacts are made to the extrinsic base using a method compatible with conventional silicon processing.

15 Claims, 19 Drawing Sheets

HETEROJUNCTION BIPOLAR TRANSISTOR (HBT) WITH SELF-ALIGNED SUB-LITHOGRAPHIC METAL-SEMICONDUCTOR ALLOY BASE CONTACTS

FIELD OF THE INVENTION

The present invention relates to contacts made to semiconductor devices, and more specifically to metal-semiconductor alloy (e.g., silicide or germanide) contacts with sub-lithographic dimensions made to the base of a heterojunction bipolar transistor (HBT). The present invention also relates to methods of fabricating sub-lithographic contacts to the HBT base.

FIELD OF THE INVENTION

The present invention relates to contacts made to semiconductor devices, and more, specifically to meta-semiconductor alloy (e.g.,silicide or germanide) contacts with sub-lithographic dimension made to the base of a heterojunction bipolar transistor (HBT). The present invention also relates to methods of fabricating sub-lithographic contacts to the HBT base.

BACKGROUND OF THE INVENTION

Reduction of the extrinsic base-collector capacitance ($C_{bex}$) improves the heterojunction bipolar transistor's (HBT's) speed. Both $f_t$ (cutoff frequency) and $f_{max}$ (maximum oscillation frequency) are dependent on $C_{box}$. In conventional HBTs much of the extrinsic base-collector junction area is required for forming the base contacts. Additionally, the metal contacts (e.g., vias) to the extrinsic base are not self-aligned to the emitter, but defined by lithography. This further increases the extrinsic base area since the layout design rules must allow for overlay error.

It is therefore desirable to fabricate an HBT having a base self-aligned to the emitter, and a small (preferably sub-lithographic; less than 100 nm) extrinsic base region to which metal contacts are also made self-aligned. The extrinsic base resistance can also be minimized by thickening the extrinsic base and by converting the top portion of the extrinsic base into a metal-semiconductor alloy such as, for example, a silicide.

In view of the foregoing, there is a need for providing an HBT with a small base-collector capacitance and a low extrinsic base resistance. The present invention provides an HBT with a sub-lithographic extrinsic base that is defined by the footprint of a sidewall spacer made adjacent to the emitter. The fabrication of the extrinsic base is therefore self-aligned to the emitter. To lower the base resistance, the extrinsic portion of the base is first thickened by selective epitaxy and then the top portion of the extrinsic base is converted into a metal-semiconductor alloy. The metal contacts to the extrinsic base are also fabricated as part of a silicidation process, and are self-aligned to the extrinsic base.

SUMMARY OF THE INVENTION

The present invention provides an HBT with a self-aligned sub-lithographic extrinsic base to which self-aligned metal-semiconductor alloy and metal contacts are made.

The inventive structure and method provide several advantages over the prior art. First, the present invention minimizes the parasitic component of the capacitance between the extrinsic base and the collector, and it lowers the base extrinsic resistance. Secondly, the present invention provides a self-align metal-semiconductor alloy (e.g., SALICIDE) process for forming metal-semiconductor alloy regions over the extrinsic base and the emitter that avoid lithography. Third, the inventive method forms metal contacts to the metal-semiconductor alloy regions of the extrinsic base, again without the use of lithography.

In a first aspect of the present invention, a semiconductor structure such as a HBT comprising, from top to bottom, an emitter, a base, and a collector isolated by a shallow trench isolation oxide is disclosed. The base has an extrinsic portion that is defined by a disposable spacer previously formed on the sidewalls of the emitter. The extrinsic base is further thickened by epitaxy and its top surface is converted into a metal-semiconductor alloy, preferably a silicide, which connects to a conductive line that extends over the shallow trench isolation oxide.

In a second aspect of the invention, a method for fabricating an HBT with a self-aligned sub-lithographic extrinsic base to which self-aligned metal-semiconductor alloy and self-aligned metal contacts are made is disclosed. The disclosed HBT comprises an emitter with thin sidewall spacers (e.g., $SiO_2$) and thick disposable spacers ($Si_3N_4$) formed by a damascene process. The extrinsic base-collector junction area is defined by the disposable spacer that is formed on the emitter's thin $SiO_2$ sidewall. The portion of the extrinsic base-collector junction, not protected by the disposable spacer, is etched out by reactive-ion etching (RIE), and later replaced by an oxide. The oxide, which is blanket deposited, is polished by chemical mechanical polishing (CMP) to the level of the emitter, and may be recessed further by some amount. The disposable spacers are etched to expose the extrinsic base.

Next, selective semiconductor epitaxy is used to thicken the extrinsic base. A blanket metal film is deposited and thereafter patterned by the mask that defines the shallow trench isolation (STI) around the device. Annealing is used to form a metal-semiconductor alloy, e.g., a silicide, by reacting the metal film with the raised base and the top of the emitter. The structure is then planarized by a second oxide deposition and CMP such that the top of the emitter is exposed. The top portion of the unreacted metal over the emitter's $SiO_2$ sidewalls is also exposed. The unreacted metal is then selectively etched (with respect to the metal-semiconductor alloy) from the sidewalls of the emitter. The unreacted metal buried beneath the oxide is protected from this etching process and remains in contact with the metal-semiconductor alloy over the raised base regions. Contact to the base is then made by a via to the buried metal.

In yet another embodiment of the present invention, which is aimed to avoid further metal-semiconductor formation, e.g., silicidation, of the base during back-end of the line (BEOL) processing, the dielectric protecting the unreacted metal is removed and that metal is converted into a metal-semiconductor alloy.

This aspect of the present invention is performed in a self-aligned manner by the following processing steps: a blanket semiconductor, e.g., silicon, layer is deposited, the buried conductive metal is converted into a metal-semiconductor alloy, e.g., a silicide, by annealing and reacting the conductive metal with the deposited semiconductor layer, and finally etching is used to remove any unreacted semiconductor (for example, a wet tetramethylammonium-hydroxide (TMAH) etch). The structure is planarized by oxide deposition and CMP. A contact to the base is made using a via to the metal-semiconductor alloy that extends over the oxide.

It is noted that the preferred metal-semiconductor alloys comprise a silicide or a germanide, with silicides being most preferred.

DETAILED DESCRIPTION OF THE INVENTION

The present invention, which provides an HBT with a self-aligned sub-lithographic extrinsic base as well as methods for fabricating the same, will now be described in greater detail by referring to the following discussion. In this discussion, reference will be made to various drawings that illustrate embodiments of the present invention. Since the drawings of the embodiments of the present invention are provided for illustrative purposes, the structures contained therein are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced with viable alternative process options without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present, In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated above, a semiconductor structure such as a HBT is provided that comprises, from top to bottom, an emitter, a base, and a collector isolated by a shallow trench isolation oxide. The base has an extrinsic portion that is defined by a disposable spacer previously formed on the emitter sidewalls. The extrinsic base is further thickened by epitaxy and its top surface is converted into a metal-semiconductor alloy, preferably a silicide, which connects to a conductive line (e.g. metal) that extends over the shallow trench isolation oxide.

Figure 1:
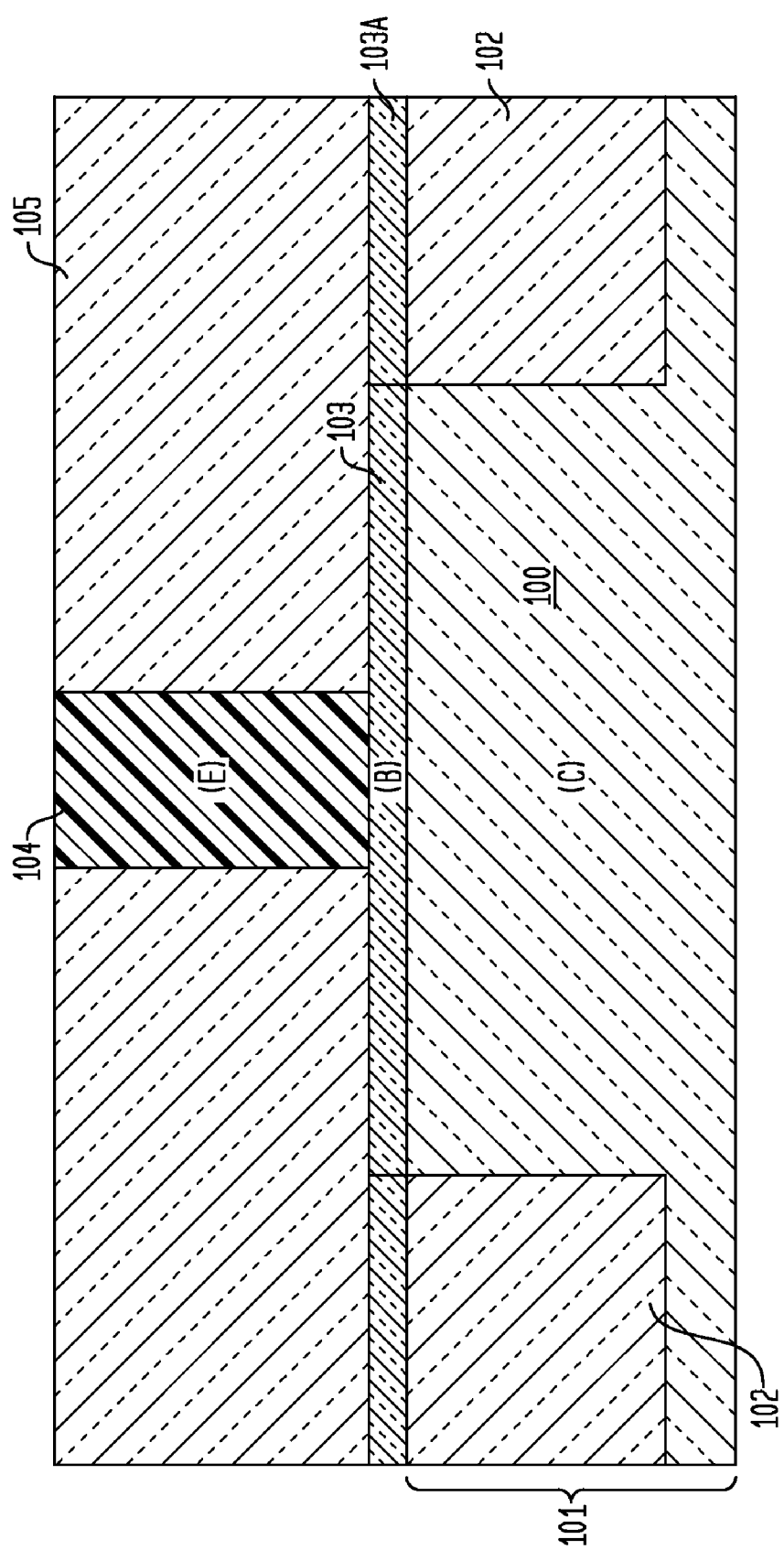
FIGS. 1-13 are pictorial representations (through cross sectional views) illustrating the basic processing steps of the present invention for fabricating an HBT with a self-aligned sub-lithographic extrinsic base including self-aligned silicide and metal contacts.

The basic method of the present invention that fabricates the above mentioned semiconductor structure is shown, for example, in FIGS. 1-13. Referring to FIG. 1, the starting semiconductor substrate consist of a semiconductor wafer, such as silicon, 101, a collector region (C) 100 isolated by a shallow trench isolation (STI) oxide 102, a base (B) consisting of a single-crystal semiconductor film region 103 formed over the collector region 100 and a polycrystalline semiconductor film 103A formed over the STI oxide 102, and an emitter (E) 104 formed over the base using a damascene process. In a highly preferred embodiment of the present invention, the wafer 101 is comprised of bulk silicon, and the semiconductor films 103 and 103A are comprised of SiGe.

The HBT base (B) is typically formed by non-selective semiconductor epitaxy. In one embodiment of the present invention, a non-selective SiGe epitaxy is employed. The base layer forms as a single-crystal semiconductor film 103 over the single-crystal semiconductor collector region 100, which serves as a template for the semiconductor epitaxy. It is noted that a portion of the single-crystal semiconductor film 103 serves as the extrinsic base of the inventive structure, Over the STI oxide 102, the base layer deposits as polycrystalline semiconductor 103A since the oxide is amorphous and does not provide a template for epitaxy. The HBT emitter (E) 104 is typically formed by deposition of poly-Si into a trench formed in an oxide 105. The excess poly-Si deposited over the oxide 105 is removed by CMP, The details of this damascene process can be found in U.S. Ser. No. 11/460,013, filed Jul. 26, 2006 (attorney docket FIS920050312US1), the disclosure of which is incorporated fully herein by reference.

Figure 2:
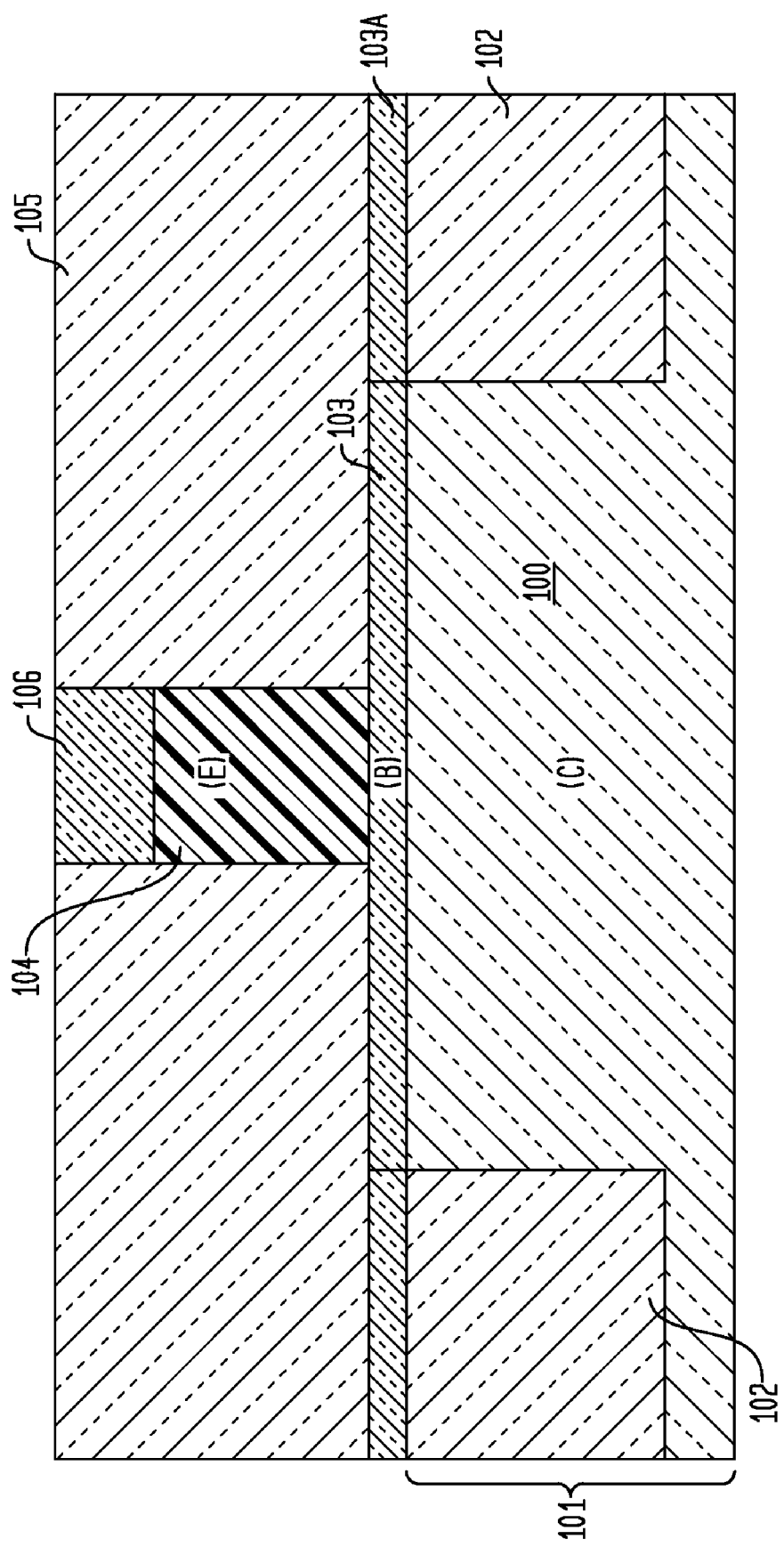
Figure 3:
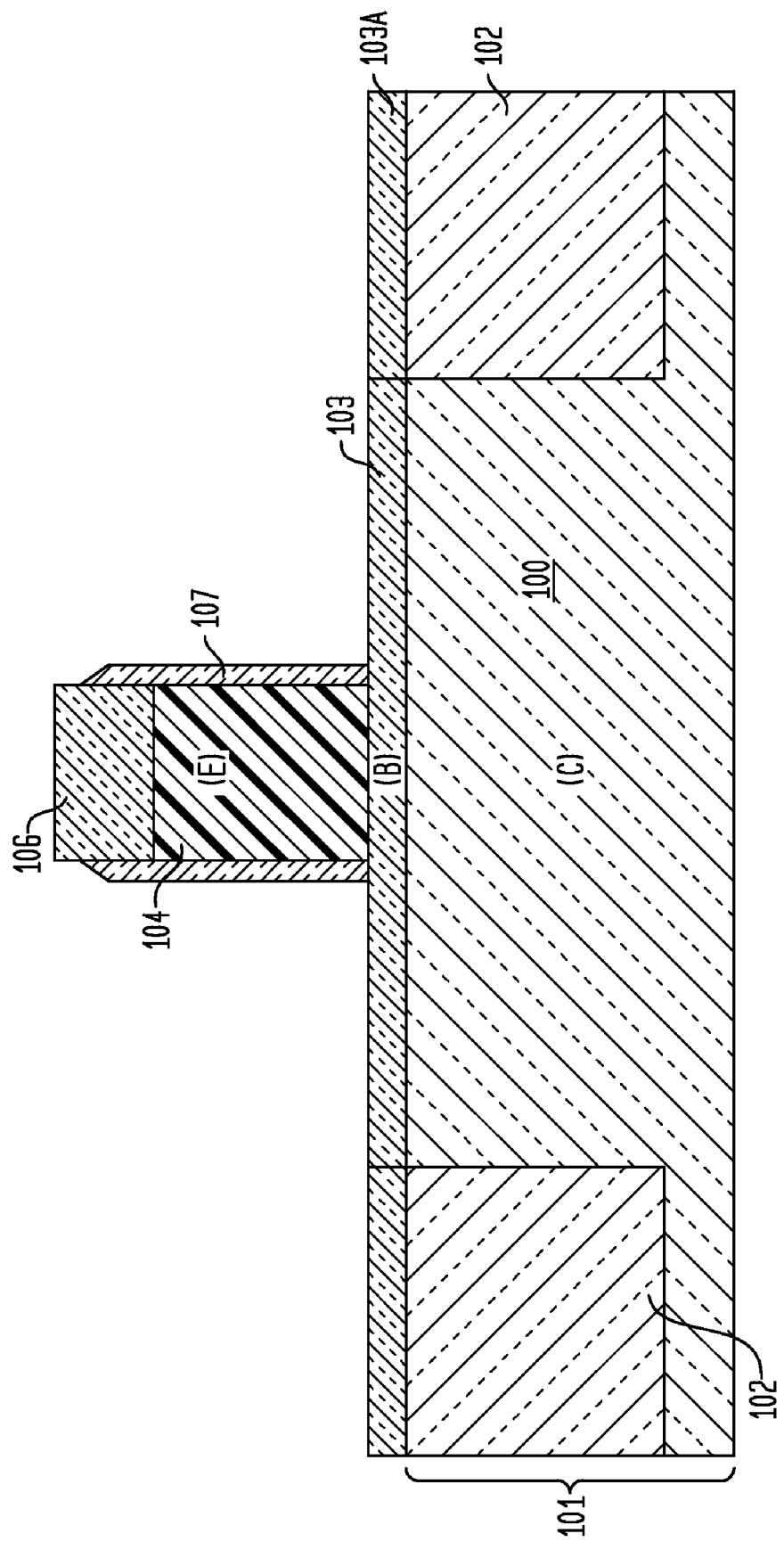
Figure 4:
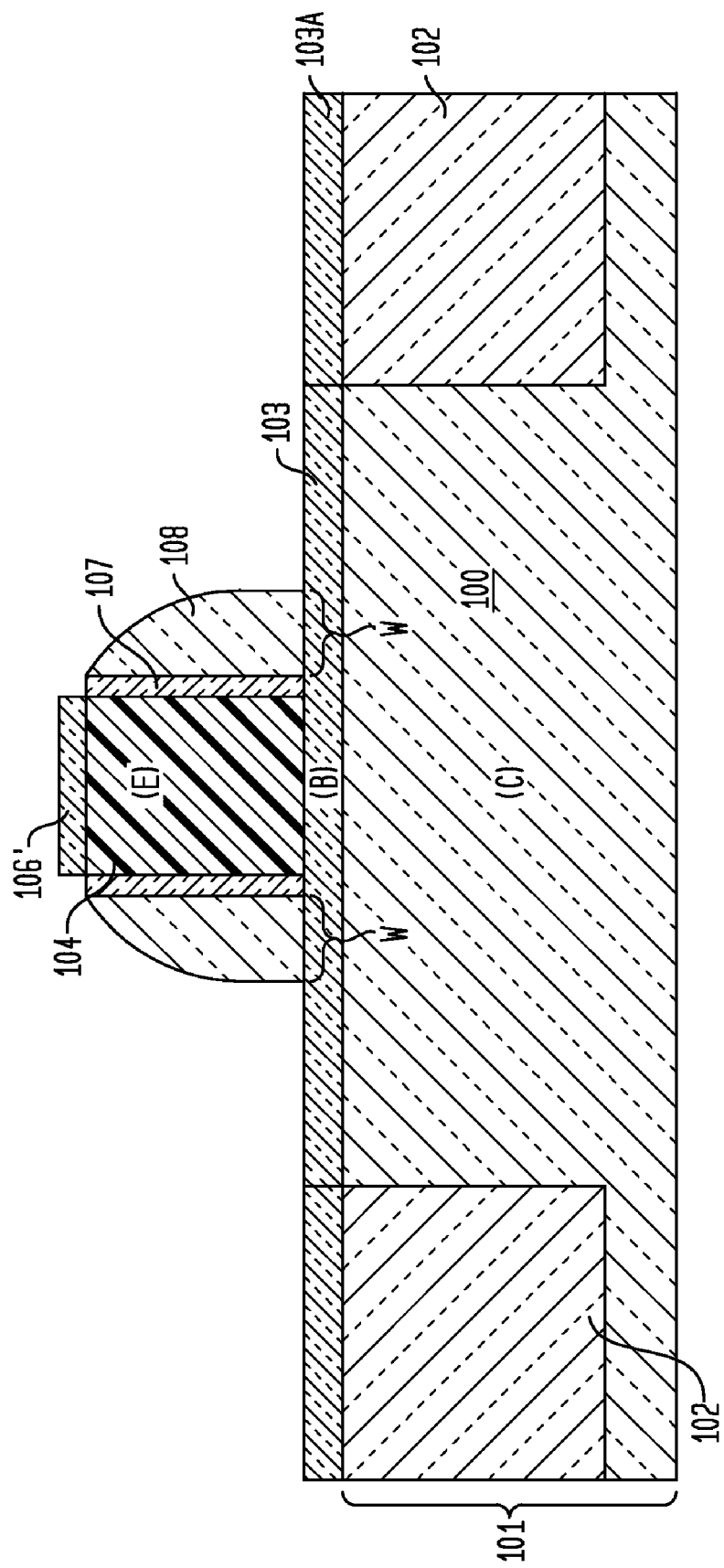

Referring to FIG. 2, the emitter 104 is recessed by conventional etching and a silicon nitride cap 106 is deposited by conventional techniques such as chemical vapor deposition, over the recessed emitter 104. The oxide 105 is thereafter etched selectively to expose the base (B) and sidewalls of the emitter (E). Referring to FIG. 3, thin $SiO_2$ spacers 107 are formed on either side of the emitter. A $Si_3N_4$ layer is blanket deposited and etched to form $Si_3N_4$ spacers 108, as illustrated in FIG. 4. During the etching process used in forming the spacers 108, the cap 106 is also etched forming emitter cap 106'.

Figure 5:
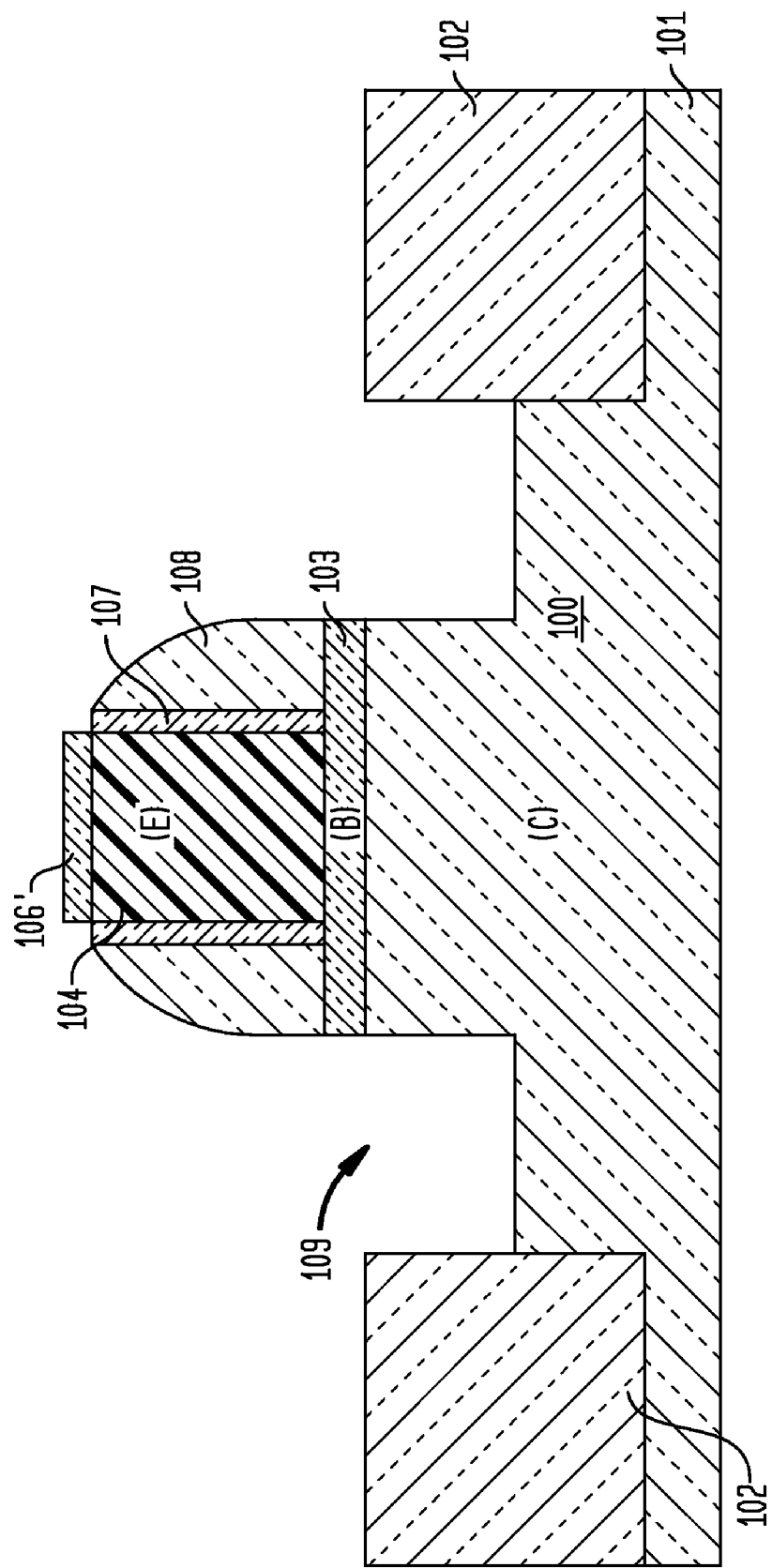

The width W of the spacer 108 footprint will later define the lateral dimension of the extrinsic base. As illustrated in FIG. 5, reactive ion etching (RIE) is used to etch the semiconductor film 103 and 103A from regions not masked by the spacer 108 or the emitter 104. The RIE chemistry is chosen to etch primarily silicon or SiGe and is selective to dielectrics such as silicon dioxide ($SiO_2$) and silicon nitride ($Si_3N_4$). As an example, RIE with HBr chemistry can have a typical etch selectivity larger than 1:100 (i.e., oxide etching is 100 times slower than silicon etching). The etching also removes some of the collector (C) material. The details of a similar collector material removal process can be found in U.S. Ser. No. 6,864,560. The amount of etching into the collector is not critical. It is noted that in FIG. 5 reference numeral 109 denotes the etched region created by this step of the present invention.

Figure 6:
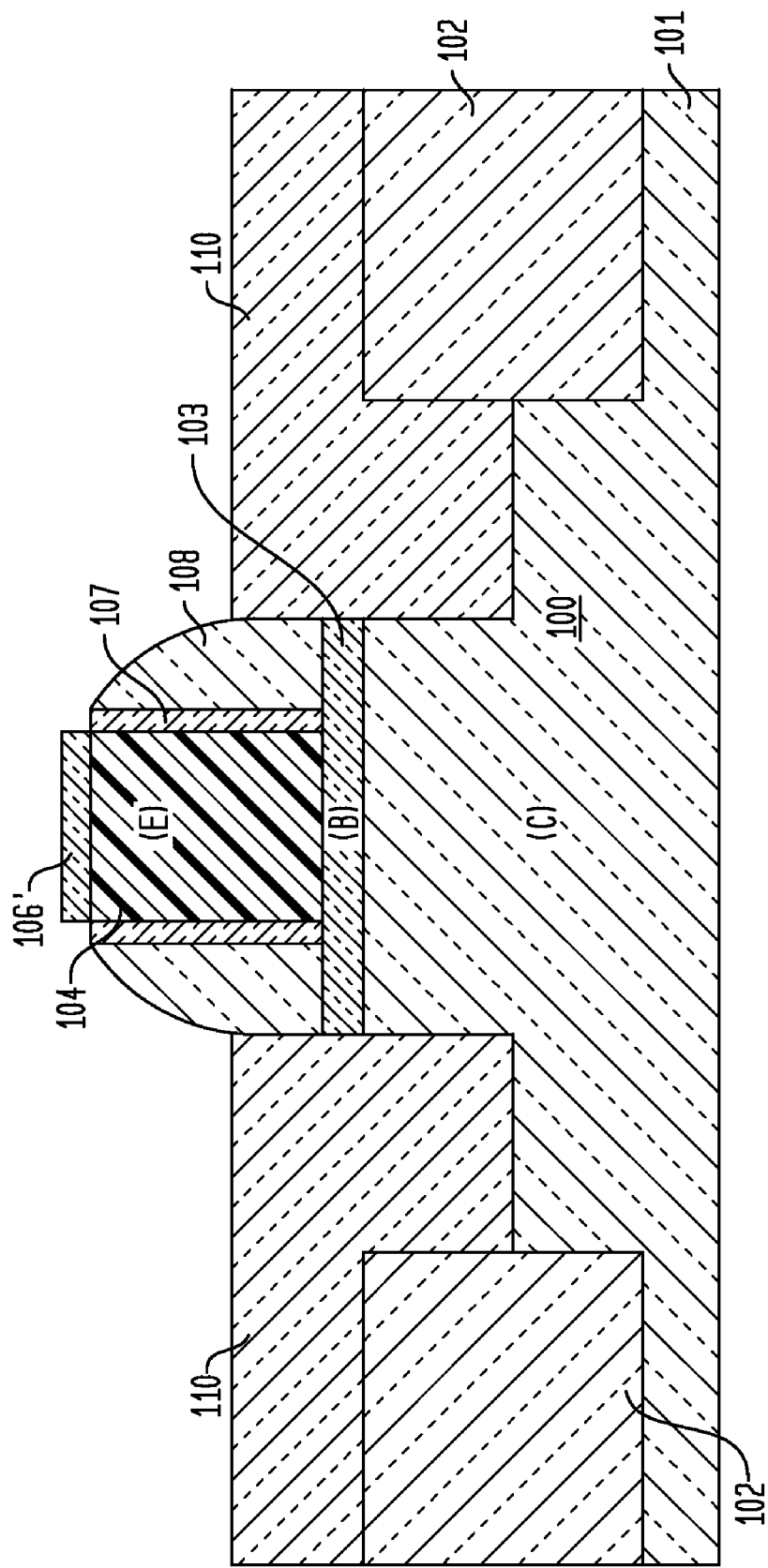

Referring to FIG. 6, an oxide or other like insulator 110 is blanket deposited, and chemical mechanical polishing (CMP) is performed to planarize the surface. The insulator 110 is polished down to the emitter cap 106' level. The insulator 110 is then recessed farther below the emitter cap 106' line, but is kept above the STI 102 line.

Figure 7:
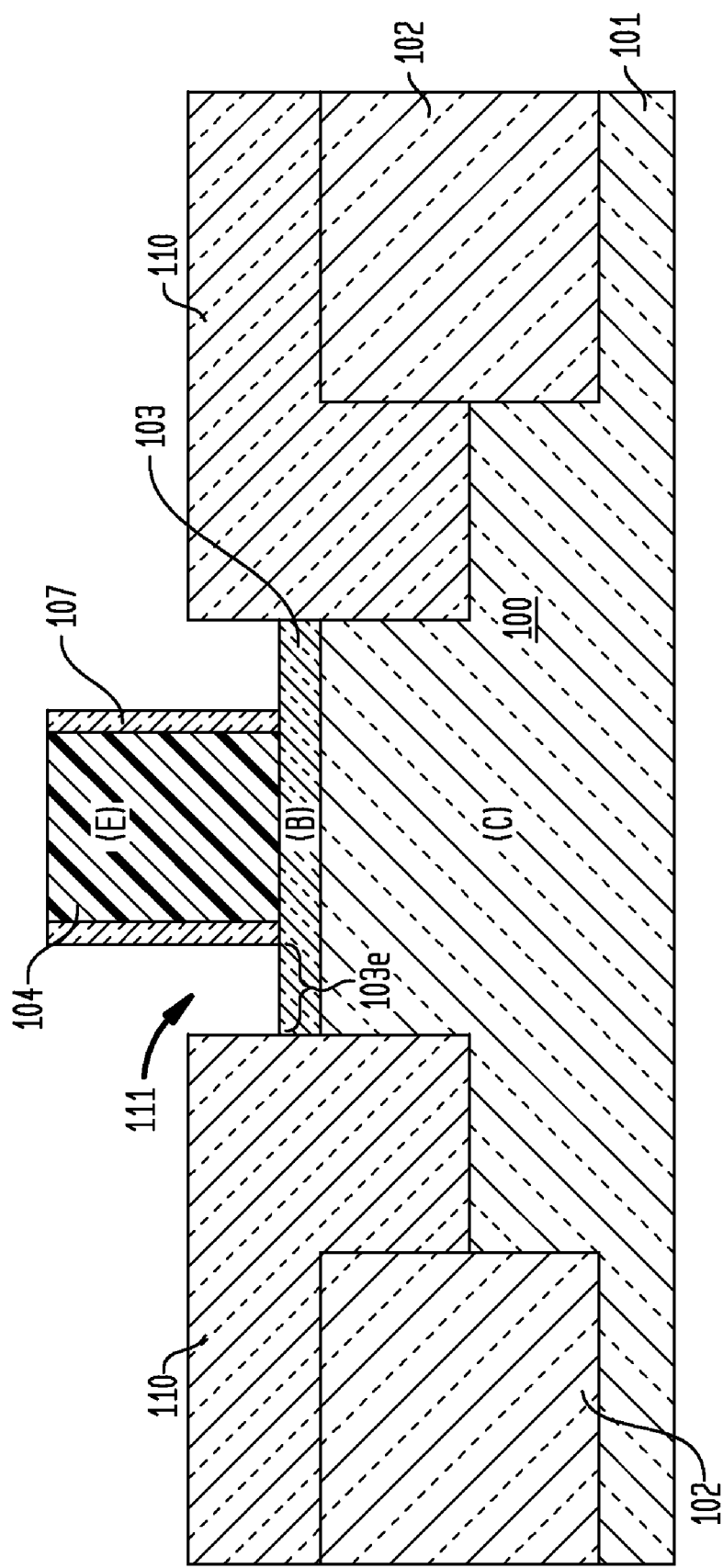
Figure 8:
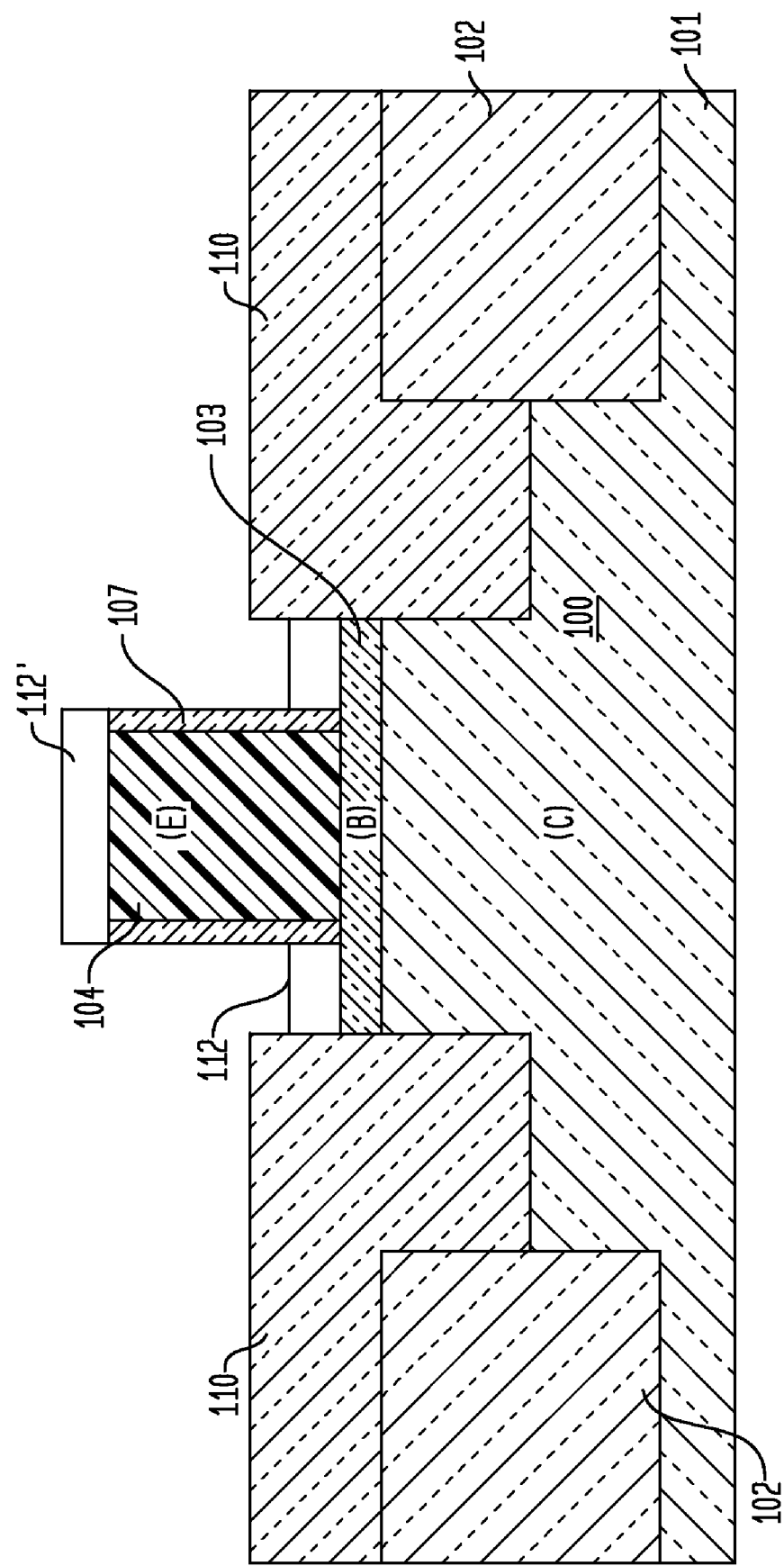

Referring to FIG. 7, the silicon nitride spacers 108 are selectively removed to expose the top surface of the semiconductor film 103. It is noted that during the removal of the spacers 108 the emitter cap 106' is also removed from the structure. The etched area previously occupied by spacers 108 is denoted by reference numeral 111 in FIG. 7. Since the semiconductor film 103 (which also forms the extrinsic base 103e) is typically made thin (on the order of about 30 nm or less) to achieve high gain in the HBT, the exposed semiconductor film 103 which forms the extrinsic base 103e has to be thickened prior to metal-semiconductor alloy, e.g., silicide, formation. The exposed portions of the semiconductor film 103 are thickened by selective semiconductor, e.g., silicon or SiGe, epitaxy (i.e., additional semiconductor 112 is deposited only over the exposed semiconductor surfaces, but not over dielectric surfaces) as illustrated by FIG. 8. Because the emitter 104 is also exposed, additional semiconductor 112' also forms atop the emitter 104.

The semiconductor 112 may be in-situ doped (i.e., the dopant atoms are added to the semiconductor lattice during epitaxy). In principle, ion implantation can also be used to dope semiconductor 112, however, an emitter capping may be required to block the dopants from doping the emitter 104. Other methods can also be employed to dope the semiconductor 112. For example, the semiconductor 112 may be selectively doped later on in the process or block masks can be formed atop the emitter and then an in-situ doped deposition process can be used to form the semiconductor selectively.

Figure 9:
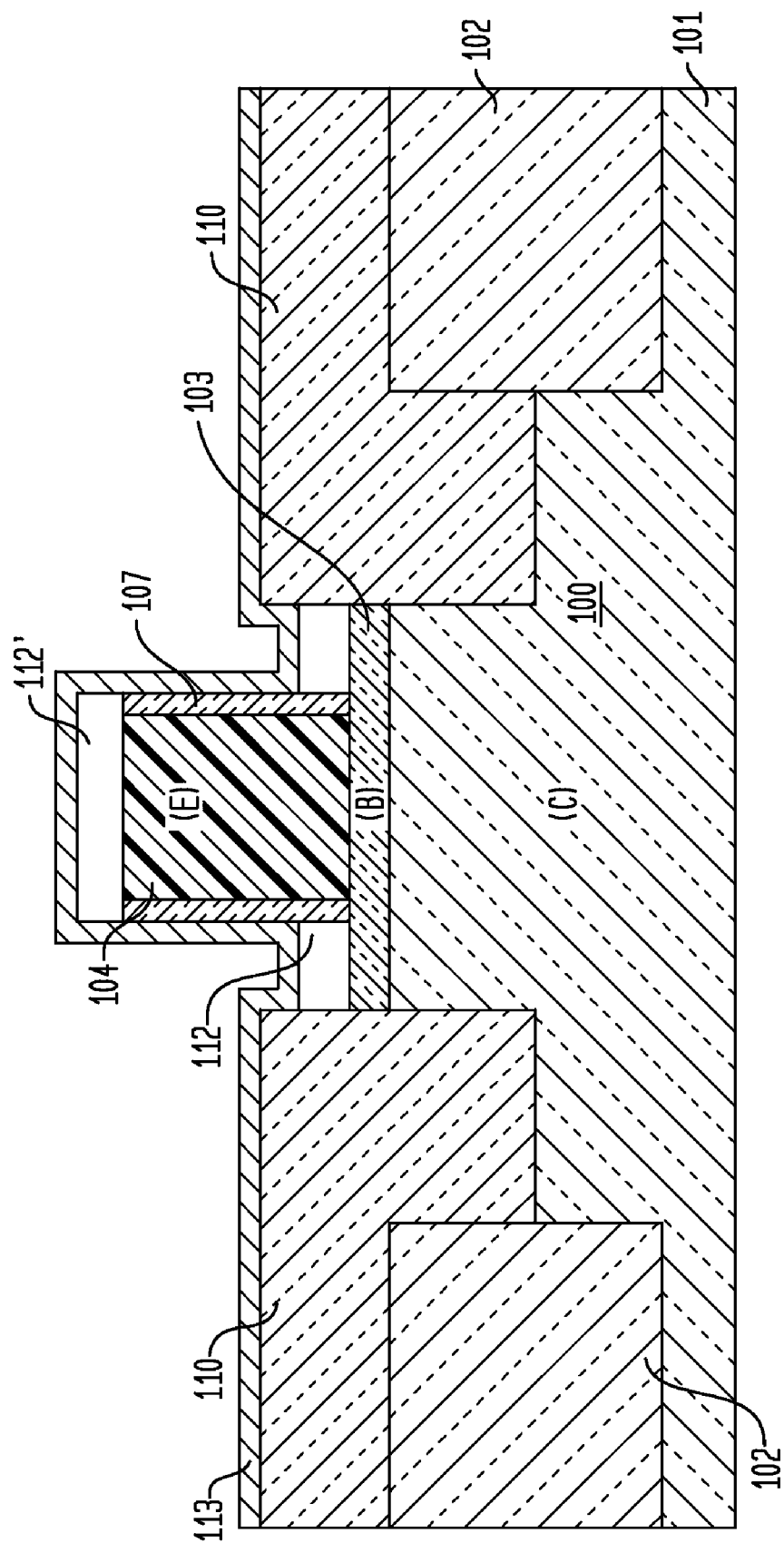

Referring to FIG. 9, a metal film 113 such as Ti, Co, Ni, Pt, W or alloys thereof is blanket deposited over the structure. The metal 113 is patterned with a mask (not shown) that is slightly larger than the mask used to define the collector (shallow trench isolation mask).

Figure 10:
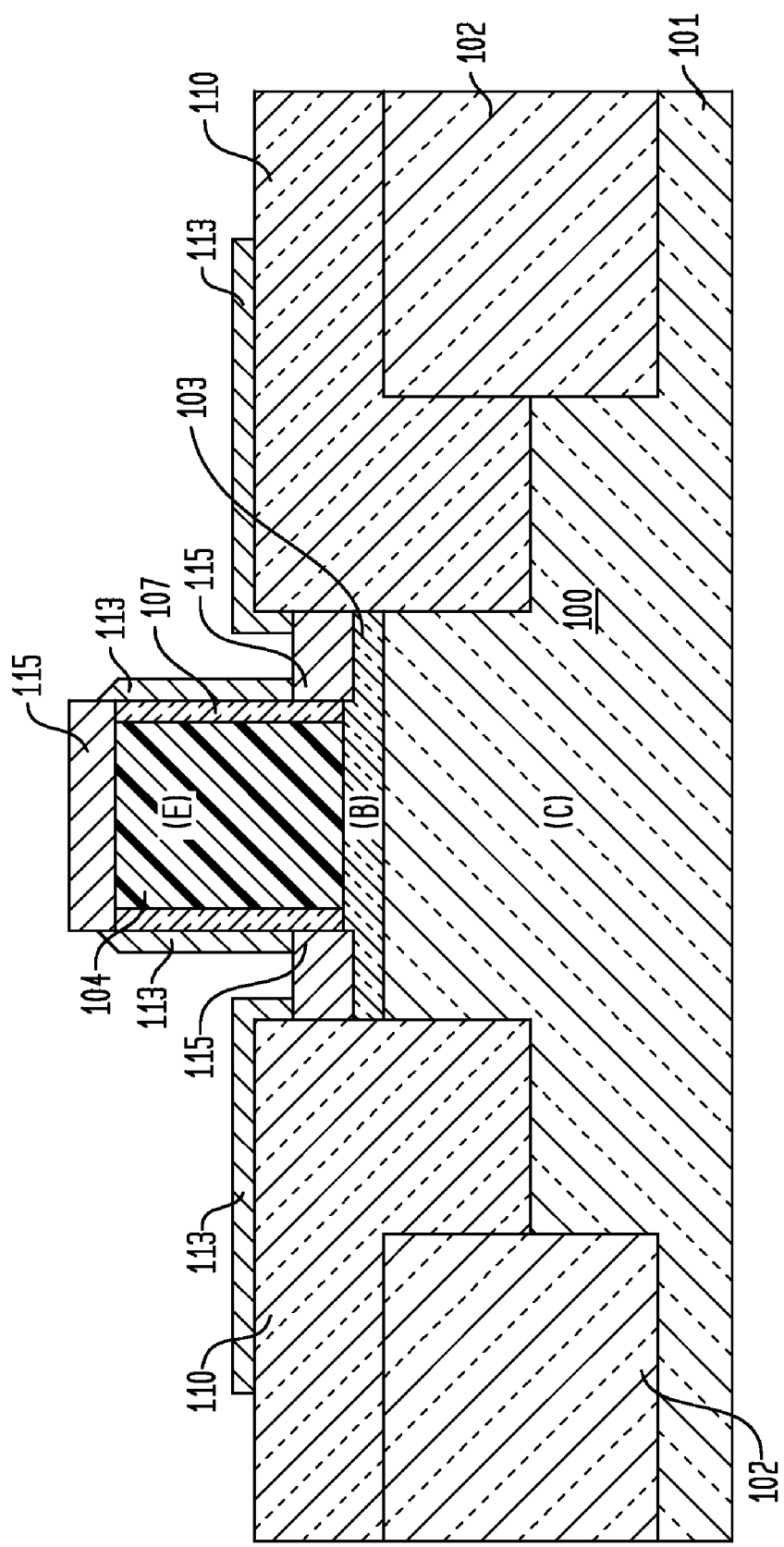

Referring to FIG. 10, a metal-semiconductor alloy 115 such as, a silicide or germanide, is formed by reacting the metal 113 with the semiconductor surface 112 and the top surface of the emitter 104. The portions of metal 113 not in contact with a semiconductor surface, e.g., over the $SiO_2$ spacers 107 and over the insulator 110, do not convert into a metal-semiconductor alloy. Reacting the metal with the semiconductor surface is typically done by rapid thermal annealing (RTA). The thickness of the metal layer 113 is chosen such that all of the added semiconductor 112' over the emitter, and some of the top emitter material 104 is reacted to from the metal-semiconductor alloy 115. This circumvents the formation of a p-n junction over the emitter (E) since the emitter (E) 104 has a different doping polarity than that of the base (B) 103.

Figure 11:
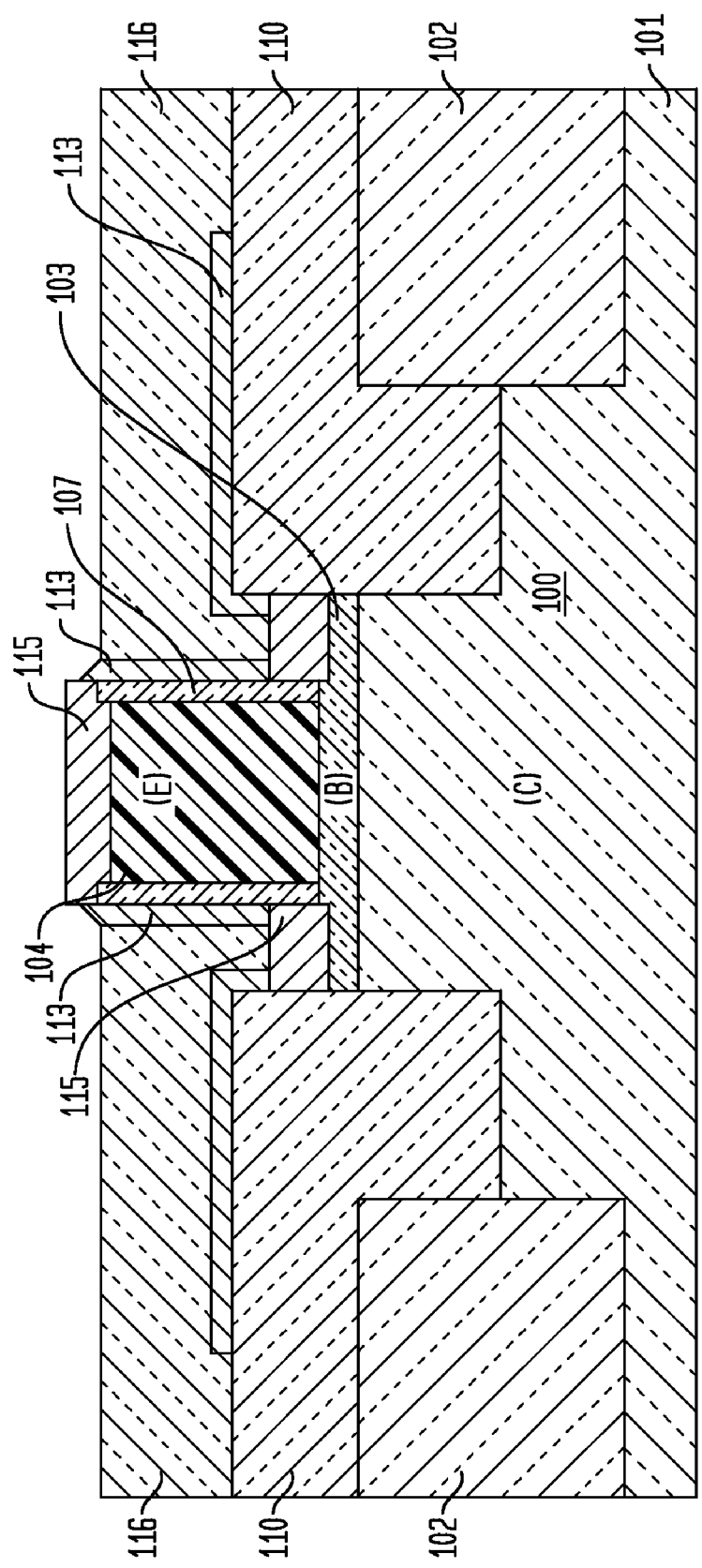

Referring to FIG. 11, an insulator 116 such as an oxide or nitride is blanket deposited over the structure. The structure is polished by CMP, such that the metal-semiconductor alloy 115 on the top of the emitter (E) is exposed. The top edge of metal 113 that covers the $SiO_2$ spacers 107 is also exposed. It is also possible to deposit the insulator 116 prior to reacting metal 113 with the semiconductor surface, and then perform the RTA step with the dielectric 116 covering the metal 113.

Figure 12:
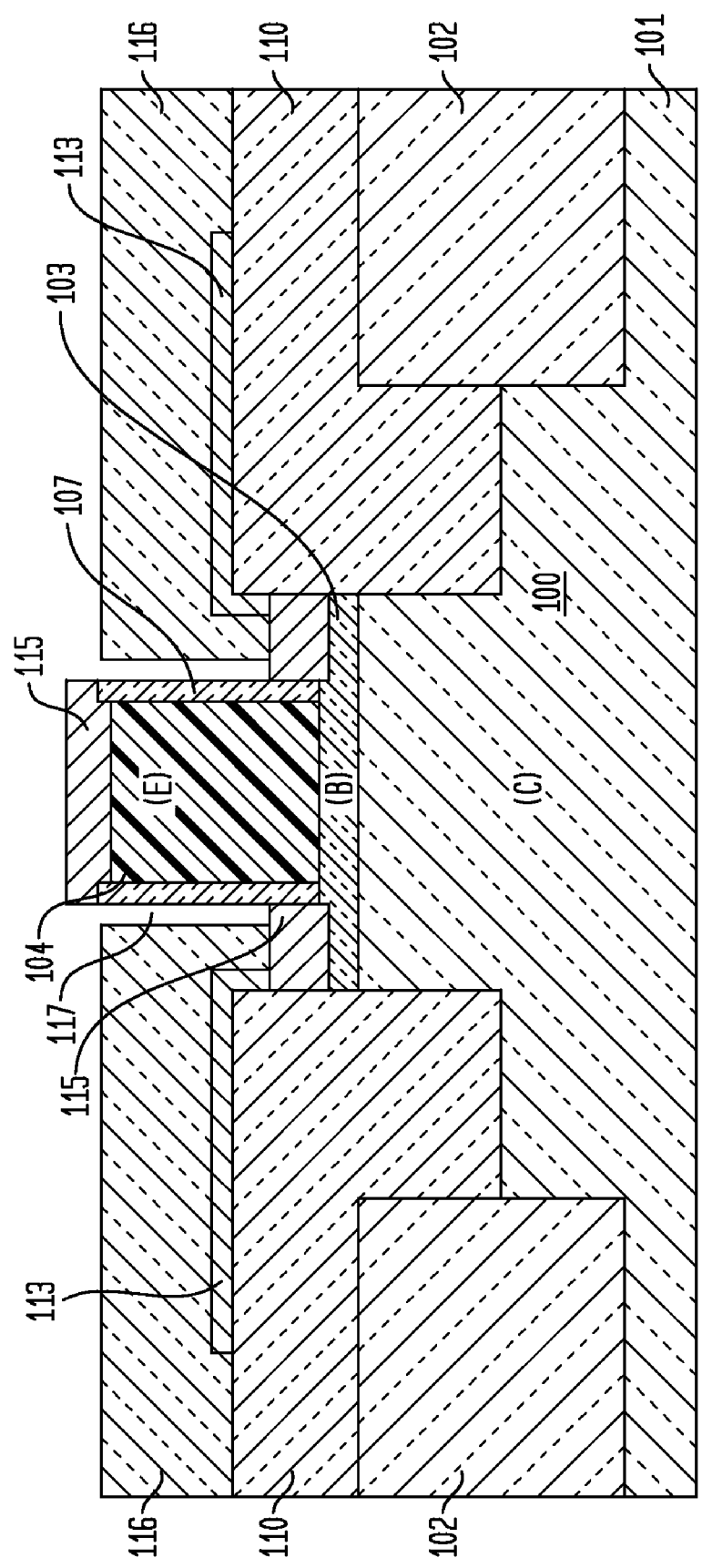

Referring to FIG. 12 the unreacted metal 113 over the $SiO_2$ spacers 107 is selectively etched with respect to the metal-semiconductor alloy 115 and the insulators. In FIG. 12, reference numeral 117 denotes the gap created after removing the unreacted metal 113. As an example, for metal-semiconductor alloys such as Ni-silicide (NiSi) and Co-silicide ($CoSi_2$) a common etch chemistry used to remove the unreacted metal is $H_2O_2$:$H_2SO_4$ 10:1 at 65° C. for 10 min. The unreacted metal 113 over the insulator 110 is not etched since it is protected by the insulator 116.

Figure 13:
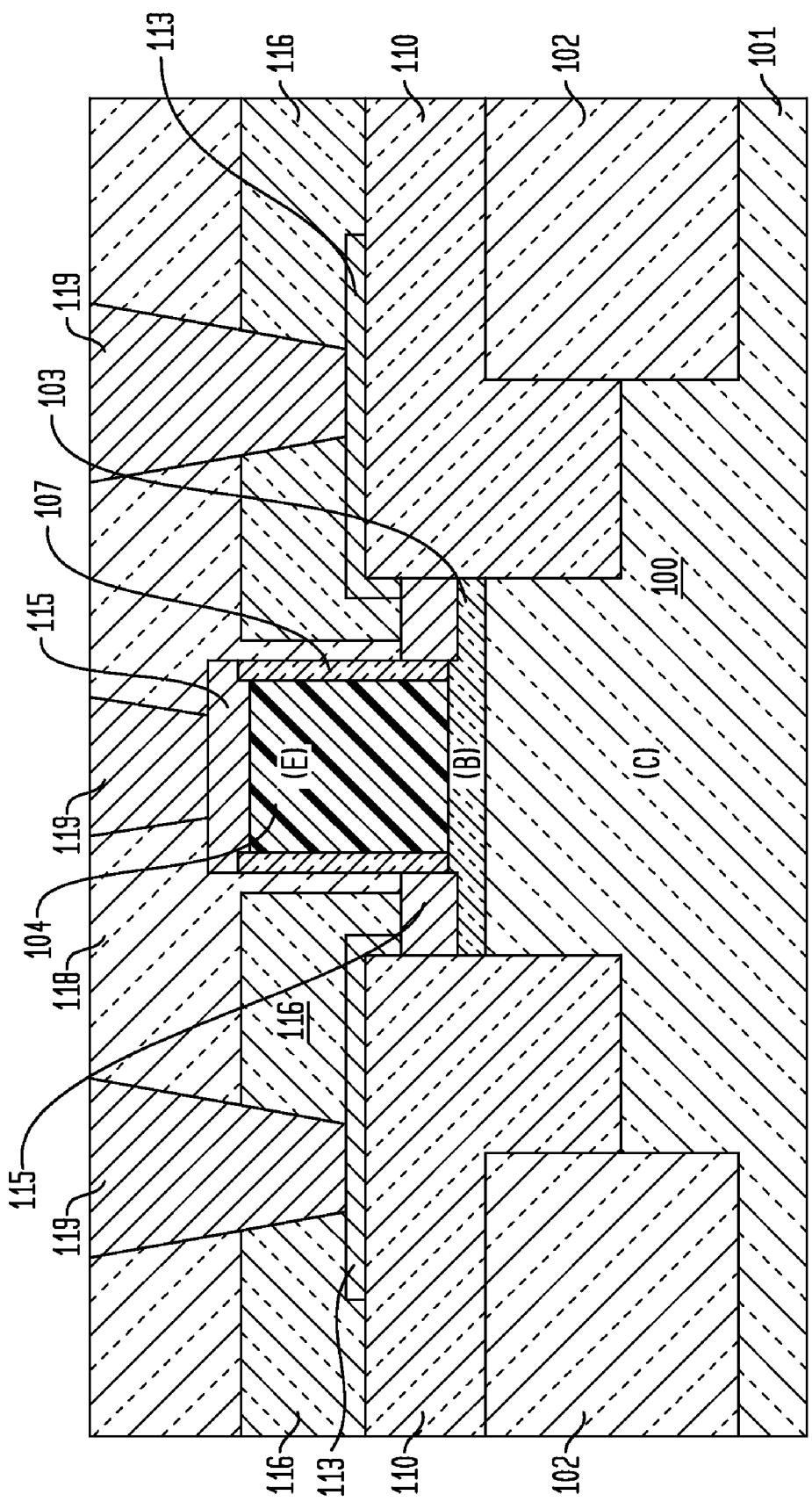
Figure 14:
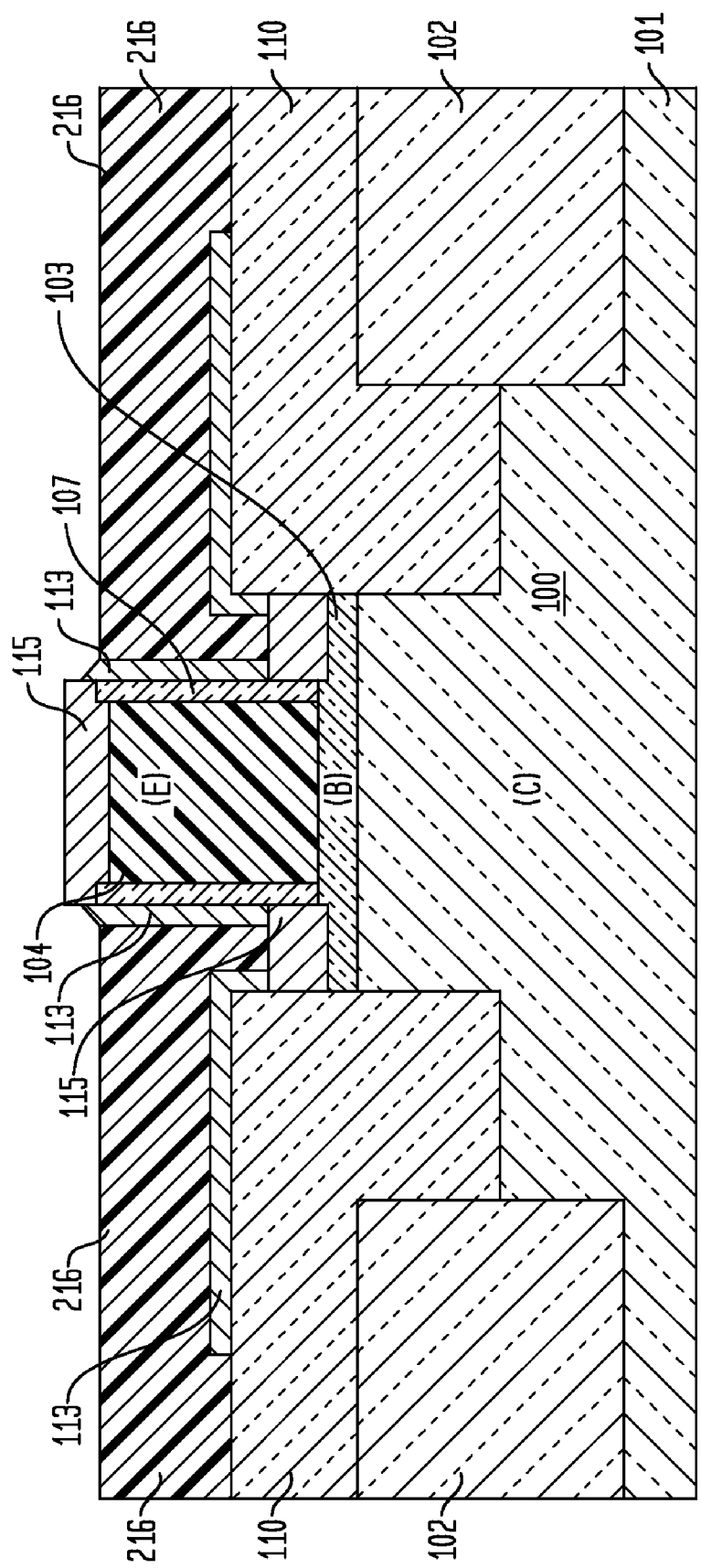
FIGS. 14-19 are pictorial representations (through cross sectional views) illustrating further processing steps that may optionally be used in the present invention in conjunction with the basic processing steps illustrated in FIGS. 1-13.

Referring to FIG. 13, an insulator 118 such as an oxide or nitride is blanket deposited over the structure. The insulator 118 also fills the gap 117 left by the etched metal 113. CMP is used to planarize the structure. Contact vias to the buried conductive extension 113, emitter and collector (not shown) are defined by lithography and RIE and filled with metal 119.

To avoid further metal-semiconductor alloy formation (e.g., silicidation) of the base during back-end of the line (BEOL) processes that requires elevated temperatures (of about 400° C.) the unreacted metal 113 is converted into a metal-semiconductor alloy. This aspect of the present invention is now described in greater detail by referring to the following discussion as well as FIGS. 14-19.

Figure 15:
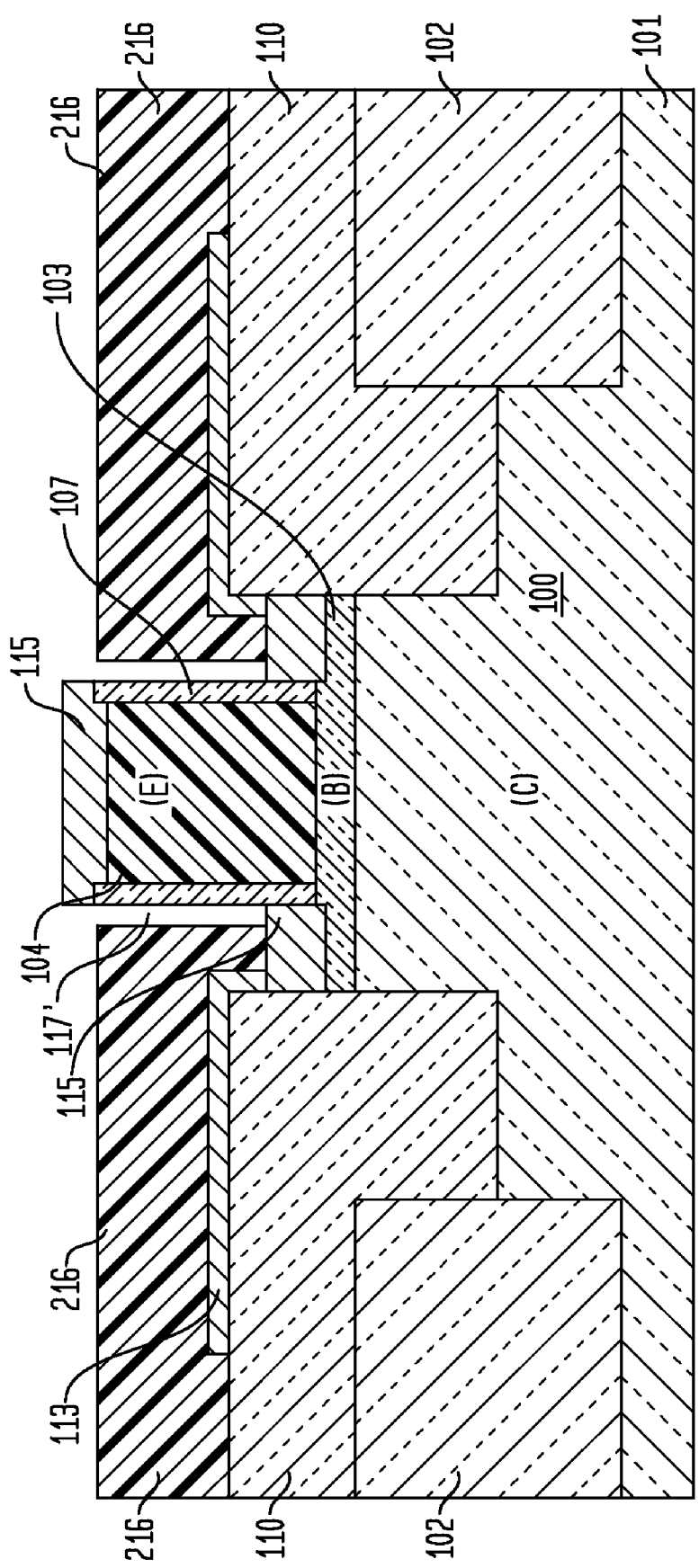

This aspect of the present invention begins with first providing the structure shown in FIG. 10. A film 216 is then blanket deposited over the substrate providing the structure shown, for example, in FIG. 14. Following the deposition, film 216 is polished to expose the top of the emitter including the edge of metal 113 that is laid over the $SiO_2$ spacers 107. The purpose of film 216 is to mask the portion of metal 113 laid over the insulator 110, while the portion of the metal 113 laid over the $SiO_2$ spacers 107 is etched out forming etched area 117' (FIG. 15). Film 216 can also consist of materials such as a polyimide or even a photoresist. These materials are deposited by spin-coating and tend to be self-planarizing (i.e., the surface topography is washed out by the film). Rather than using CMP for planarization, it is possible to etch these materials until the top surface of the emitter is exposed. Typical etching techniques that can be used comprises of oxygen plasma and reactive ion etching.

As stated above and illustrated in FIG. 15, the unreacted metal 113 over the $SiO_2$ spacers 107 is selectively etched with respect to the metal-semiconductor alloy 115 and the insulators forming etched area 117'. The details of the etching chemistry were discussed earlier in reference to FIG. 12.

Figure 16:
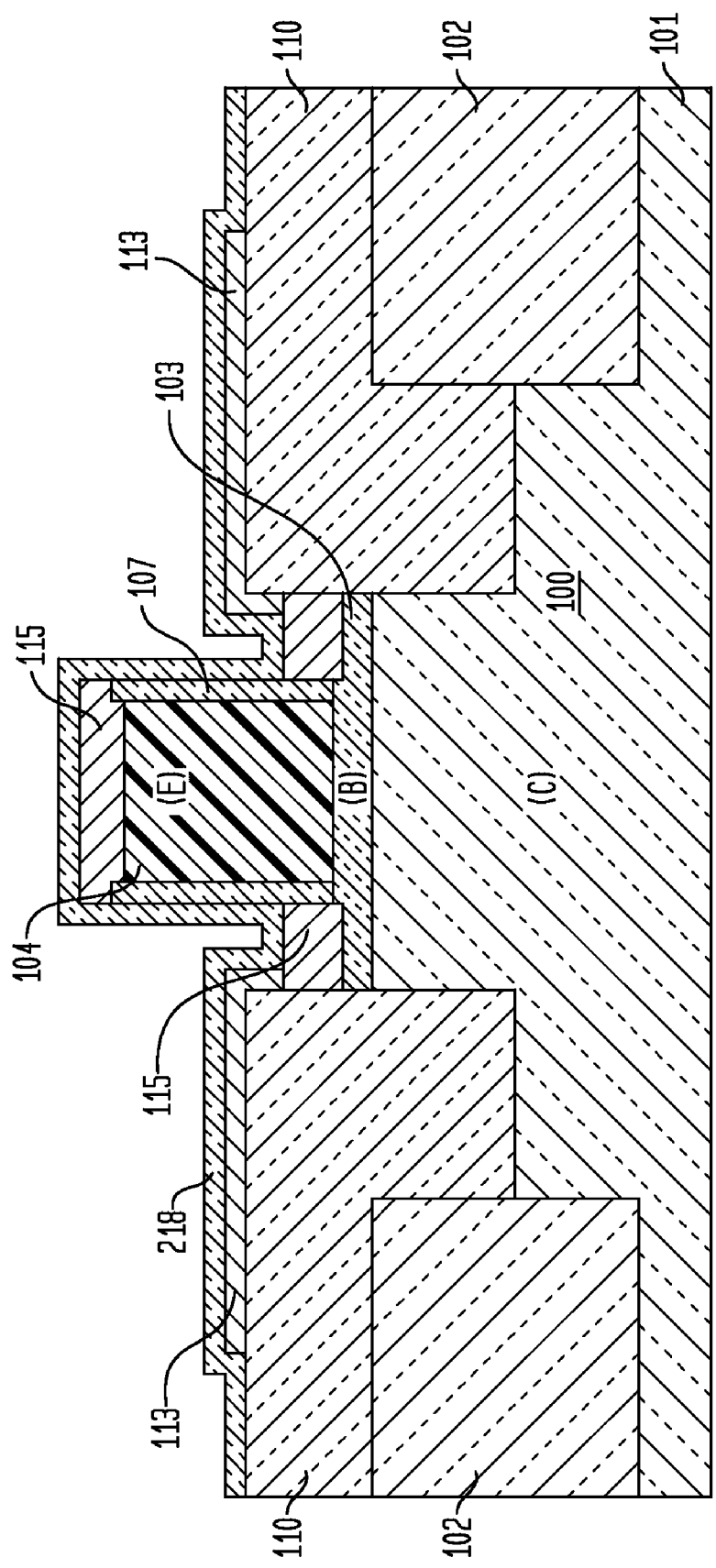
Figure 17:
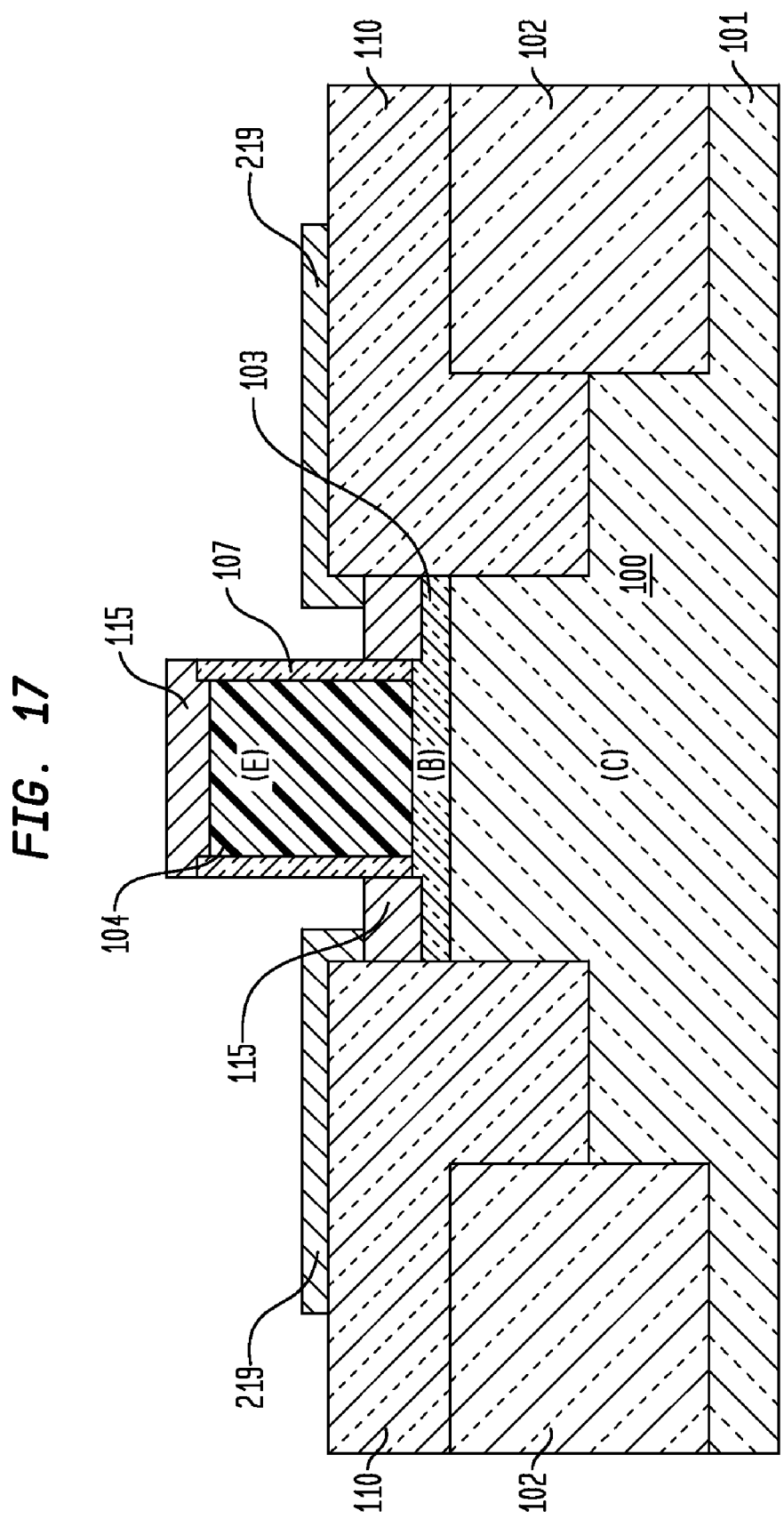

Next, and as shown in FIG. 16, film 216 is stripped to expose the metal 113. A blanket film of silicon (or other like semiconductor) 218 is deposited over the structure. The silicon (or other like semiconductor) film 218 is reacted with the metal 113 to form a silicide (or other like metal-semiconductor alloy) 219 as illustrated in FIG. 17. The silicide (or other like metal-semiconductor alloy) 219 formation is carried out by a rapid thermal anneal similar to that used to form the metal-semiconductor alloy 115. The silicide (or other like metal-semiconductor alloy) 219 forms only where a metal 113 exist. In regions not covered by the metal 113, the silicon (or other like semiconductor) film 218 does not react. The unreacted semiconductor material, e.g., silicon, is removed by a selective etch. As an example, tetramethylammonium-hydroxide (TMAH) can be used to etch the unreacted silicon with very little etching of $SiO_2$, $Si_3N_4$ and most silicides.

Figure 18:
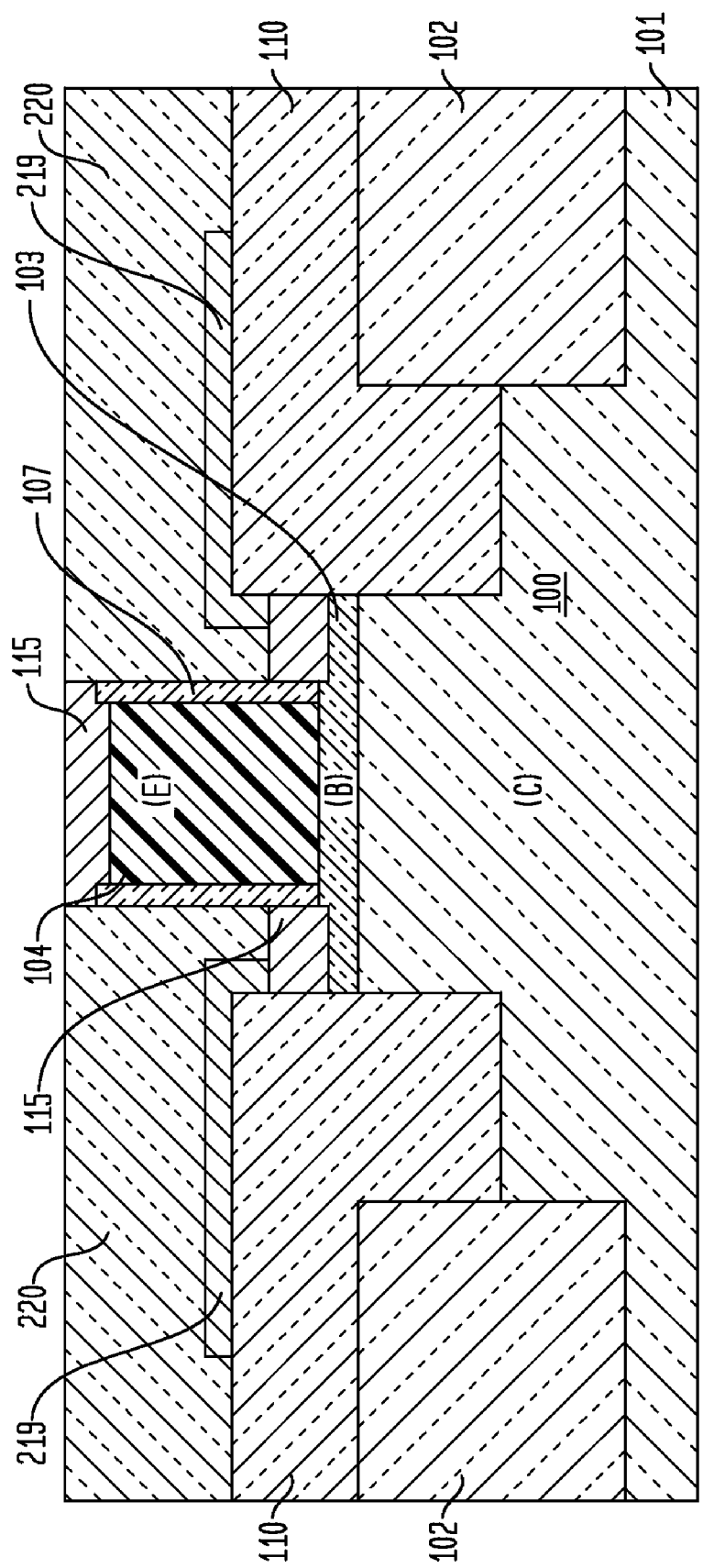
Figure 19:
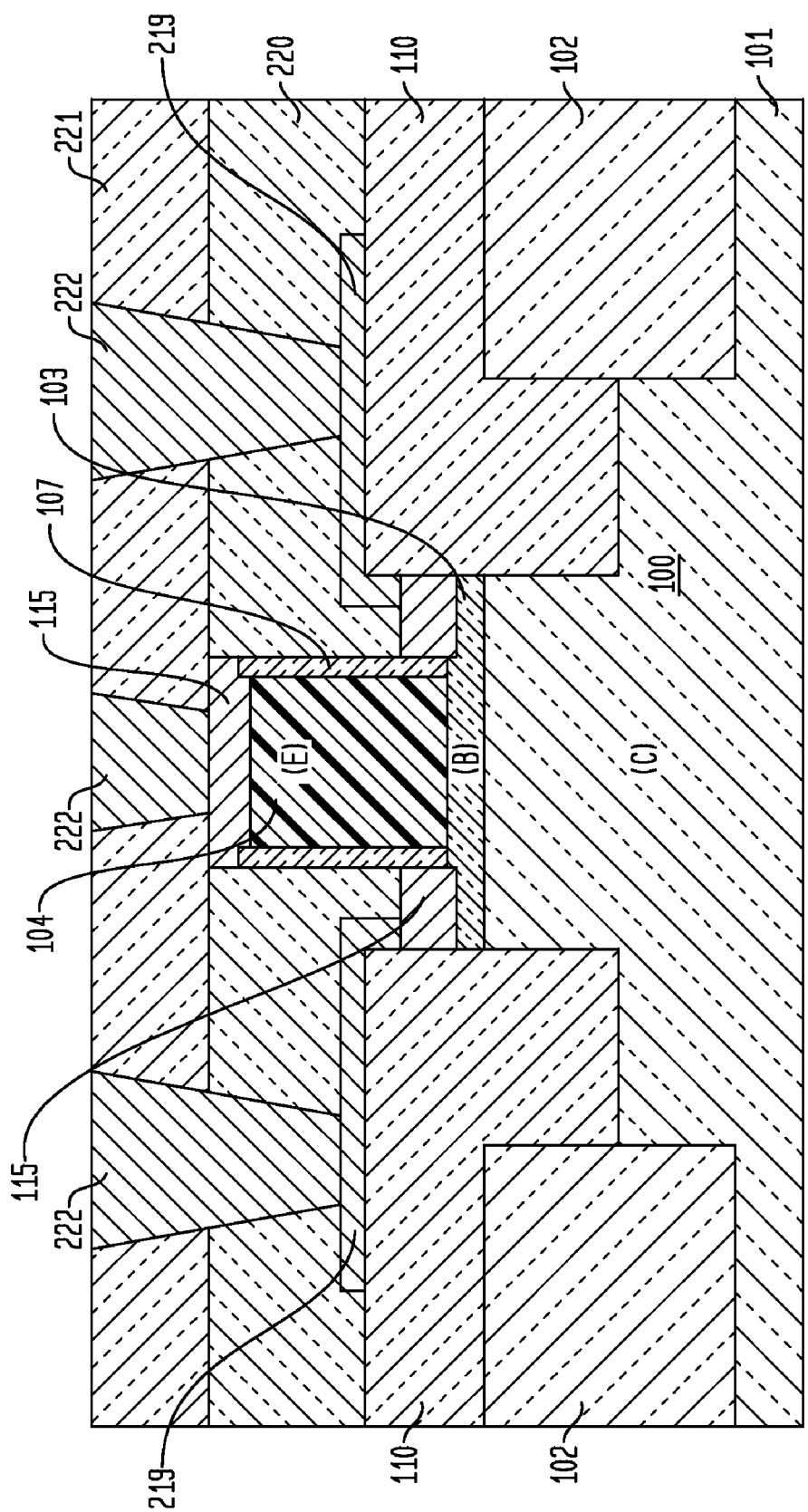

The remaining processing steps of the present invention are shown in FIGS. 18 and 19. Specifically, a dielectric film 220 is blanket deposited over the structure and planarized. A second dielectric film 221 is deposited over the planarized dielectric film 220, and via holes are made to the base, emitter and collector (not shown). The via holes are filled with metal 222 such as W, Cu, Al, or CuAl to form contacts to the device.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A heterojunction bipolar transistor (HBT) comprising:
   a stack including, from top to bottom, an emitter, a base and a collector;
   an extrinsic base adjacent to said base and located directly on an upper surface of said collector, wherein a lateral dimension of said extrinsic base is defined by the footprint of a sacrificial spacer, and wherein said base and said extrinsic base are both comprised of a same single-crystal semiconductor material;
   a metal-semiconductor alloy region located directly on an upper surface of said extrinsic base;
   buried conductive lines connecting to an edge of said metal-semiconductor alloy region;
   a shallow trench isolation region adjacent to said collector; and an insulator located directly on and in contact with an upper surface of the shallow trench isolation region, and wherein a portion of said buried conductive lines is located directly on and in contact with an upper surface of the insulator.

2. The HBT of claim 1 wherein said metal semiconductor alloy is one of NiSi, CoSi$_2$, and PtSi$_2$.

3. The HBT of claim 1 further comprising an epitaxial layer of a semiconductor located on top of said extrinsic base.

4. The HBT of claim 3 wherein said epitaxial layer of a semiconductor comprises epitaxial SiGe.

5. The HBT of claim 1 wherein said base comprises SiGe and said extrinsic base comprises SiGe.

6. The HBT of claim 1 wherein said buried conductive lines comprise one of Ti, Co, Ni, Pt, W or a metal-semiconductor alloy.

7. The HBT of claim 1 wherein a vertical edge of said metal-semiconductor alloy region is in direct contact with an vertical edge of said insulator.

8. A heterojunction bipolar transistor (HBT) comprising:
a stack including, from top to bottom, an emitter, a base and a collector;
an extrinsic base adjacent to said base and located directly on an upper surface of said collector, wherein lateral dimension of said extrinsic base is defined by the footprint of a sacrificial spacer, and wherein said base and said extrinsic base are both composed of a same single-crystal semiconductor material;
a silicide region located directly on an upper surface of said extrinsic base;
buried silicide lines connecting to the edge of said silicide region.
a shallow trench isolation region adjacent to said collector; and
an insulator located directly on and in contact with an upper surface of said shallow trench isolation region, wherein a portion of said buried silicide lines are located directly on an in contact with an upper surface of the insulator.

9. The HBT of claim 8 wherein said silicide region is one of NiSi, CoSi$_2$, and PtSi$_2$.

10. The HBT of claim 8 wherein said buried silicide lines are one of NiSi, CoSi$_2$, and PtSi$_2$.

11. The HBT of claim 8 further comprising an epitaxial layer of a semiconductor located on top of said extrinsic base.

12. The HBT of claim 11 wherein said epitaxial layer of a semiconductor comprises epitaxial SiGe.

13. The HBT of claim 8 wherein said base comprises SiGe and said extrinsic base comprises SiGe.

14. The HBT of claim 8 wherein a vertical edge of said silicide region is in direct contact with an vertical edge of said insulator.

15. A heterojunction bipolar transistor (HBT) comprising:
a stack including, from top to bottom, an emitter, a base and a collector;
an extrinsic base adjacent to said base and located directly on an upper surface of said collector, wherein a lateral dimension of said extrinsic base is defined by the footprint of a sacrificial spacer, and wherein said base and said extrinsic base are both comprised of a same single-crystal semiconductor material;
a metal-semiconductor alloy region located directly on an upper surface of said extrinsic base;
buried conductive lines connecting to an edge of said metal-semiconductor alloy region; and
a shallow trench isolation region adjacent to said collector, wherein no polycrystalline semiconductor material is located on and in direct contact with an upper surface of said shallow trench isolation region.

* * * * *